(12) United States Patent
Rappaport et al.

(10) Patent No.: US 7,711,687 B2
(45) Date of Patent: *May 4, 2010

(54) METHOD AND SYSTEM FOR USING RASTER IMAGES TO CREATE A TRANSPORTABLE BUILDING DATABASE FOR COMMUNICATIONS NETWORK ENGINEERING AND MANAGEMENT

(75) Inventors: Theodore Rappaport, Salem, VA (US); Roger Skidmore, Blacksburg, VA (US)

(73) Assignee: Wireless Valley Communications, Inc., Austin, TX (US)

( * ) Notice: Subject to any disclaimer, the term of this patent is extended or adjusted under 35 U.S.C. 154(b) by 1510 days.

This patent is subject to a terminal disclaimer.

(21) Appl. No.: 10/807,388

(22) Filed: Mar. 24, 2004

(65) Prior Publication Data

US 2004/0177085 A1 Sep. 9, 2004

Related U.S. Application Data

(60) Division of application No. 09/633,120, filed on Aug. 4, 2000, now Pat. No. 6,721,769, which is a continuation-in-part of application No. 09/318,841, filed on May 26, 1999, now Pat. No. 6,850,946.

(51) Int. Cl.
*G06F 7/00* (2006.01)
*G06F 17/30* (2006.01)
*G06F 12/00* (2006.01)
*G06F 15/16* (2006.01)

(52) U.S. Cl. .................. 707/101; 707/10; 707/201; 709/217; 709/218

(58) Field of Classification Search .............. 707/1, 707/103 R, 3, 10, 100, 104.1, 101, 205; 345/629; 703/1, 2, 5, 13, 20, 22; 709/217, 218; 702/150, 702/152, 153, 182, 186; 455/422.1, 3.01, 455/450; 348/460, 563, 906
See application file for complete search history.

(56) References Cited

U.S. PATENT DOCUMENTS 4,675,147 A 6/1987 Schaefer et al.

(Continued)

OTHER PUBLICATIONS

Biddiscombe, J.; Nix, A.; Murphy, S.; and Lister, D.; "The technical working party on Mobile and terrestrial propagation format for a 3D geographical dataset"; Oct. 28-29, 1998; p. 1.*

(Continued)

*Primary Examiner*—Ella Colbert
(74) *Attorney, Agent, or Firm*—Barbara R. Doutre

(57) ABSTRACT

A Building Database Manipulator to build databases for a variety of physical environments including definitions of buildings, terrain and other site parameters, by scanning in or rapidly editing data. Raster scans may be entered or object files in various formats may be used as input. Detailed information is stored in the drawing database about the object's location, radio frequency attenuation, color, and other physical information such as electrical characteristics and intersections of the object with the ground, floors, ceilings, and other objects when objects are formatted in a drawing. The formatting process is strictly two-dimensional in nature, but the resulting drawing is a true three-dimensional environment. The user sees the three-dimensional building structure by altering the views. The resulting database may be used in a variety of modeling applications, but is especially useful for engineering, planning and management tools for in-building or microcell wireless systems. Grouping objects in layers allows for simultaneous conversion of all objects in one layer to have certain predetermined attributes (e.g., converting objects to be made from glass versus cement; converting objects within a layer to have a uniform, smaller or larger, height or width dimension).

18 Claims, 10 Drawing Sheets

U.S. PATENT DOCUMENTS

| | | | |
|---|---|---|---|
| 4,736,453 | A | 4/1988 | Schloemer |
| 4,885,694 | A | 12/1989 | Pray et al. |
| 4,964,060 | A | 10/1990 | Hartsog .......................... 703/1 |
| 5,111,392 | A | 5/1992 | Malin |
| 5,119,307 | A | 6/1992 | Blaha et al. |
| 5,239,487 | A | 8/1993 | Horejsi et al. |
| 5,272,642 | A * | 12/1993 | Suzuki ....................... 700/182 |
| 5,293,640 | A | 3/1994 | Gunmar et al. |
| 5,307,261 | A | 4/1994 | Maki et al. |
| 5,337,149 | A | 8/1994 | Kozah et al. |
| 5,339,184 | A | 8/1994 | Tang |
| 5,375,123 | A | 12/1994 | Andersson et al. |
| 5,394,522 | A | 2/1995 | Sanchez-Frank et al. |
| 5,450,615 | A | 9/1995 | Fortune et al. |
| 5,458,123 | A | 10/1995 | Unger |
| 5,465,390 | A | 11/1995 | Cohen |
| 5,467,441 | A | 11/1995 | Stone et al. |
| 5,482,050 | A | 1/1996 | Smokoff et al. |
| 5,485,568 | A | 1/1996 | Venable et al. |
| 5,491,644 | A | 2/1996 | Pickering et al. |
| 5,491,837 | A | 2/1996 | Haartsen |
| 5,493,679 | A | 2/1996 | Virgil et al. |
| 5,515,269 | A | 5/1996 | Willis et al. |
| 5,528,518 | A | 6/1996 | Bradshaw et al. |
| 5,539,665 | A | 7/1996 | Lamming et al. |
| 5,553,312 | A | 9/1996 | Gattey et al. |
| 5,553,620 | A | 9/1996 | Snider et al. |
| 5,555,354 | A | 9/1996 | Strasnick et al. |
| 5,561,841 | A | 10/1996 | Markus |
| 5,564,070 | A | 10/1996 | Want et al. |
| 5,586,254 | A | 12/1996 | Kondo et al. |
| 5,594,946 | A | 1/1997 | Menich et al. |
| 5,598,532 | A | 1/1997 | Liron |
| 5,625,827 | A | 4/1997 | Krause et al. |
| 5,636,344 | A | 6/1997 | Lewis |
| 5,668,736 | A * | 9/1997 | Douglas et al. ................. 703/1 |
| 5,689,355 | A | 11/1997 | Okubo et al. |
| 5,689,705 | A | 11/1997 | Fino et al. ................... 707/201 |
| 5,710,758 | A | 1/1998 | Soliman et al. |
| 5,755,072 | A | 5/1998 | Lingafelter |
| 5,761,093 | A | 6/1998 | Urbish et al. |
| 5,761,674 | A | 6/1998 | Ito .......................... 707/104.1 |
| 5,774,669 | A | 6/1998 | George et al. |
| 5,794,128 | A | 8/1998 | Brockel et al. |
| 5,799,154 | A | 8/1998 | Kuriyan |
| 5,802,146 | A | 9/1998 | Dulman |
| 5,809,282 | A | 9/1998 | Cooper et al. |
| 5,815,395 | A | 9/1998 | Hart et al. |
| 5,821,937 | A | 10/1998 | Tonelli et al. |
| 5,825,759 | A | 10/1998 | Liu |
| 5,828,960 | A | 10/1998 | Tang et al. |
| 5,831,610 | A | 11/1998 | Tonelli et al. |
| 5,832,389 | A | 11/1998 | Dent |
| 5,845,124 | A | 12/1998 | Berman |
| 5,861,887 | A | 1/1999 | Butler et al. |
| 5,867,112 | A | 2/1999 | Kost |
| 5,877,777 | A | 3/1999 | Colwell |
| 5,878,328 | A | 3/1999 | Chawla et al. |
| 5,907,494 | A | 5/1999 | Dangelo et al. ................. 703/1 |
| 5,907,850 | A | 5/1999 | Krause et al. |
| 5,917,808 | A | 6/1999 | Kosbab |
| 5,923,850 | A | 7/1999 | Barroux |
| 5,926,762 | A | 7/1999 | Arpee et al. |
| 5,940,196 | A | 8/1999 | Piehler et al. |
| 5,945,976 | A | 8/1999 | Iwamura et al. |
| 5,948,055 | A | 9/1999 | Pulsipher et al. |
| 5,949,335 | A | 9/1999 | Maynard |
| 5,949,988 | A * | 9/1999 | Feisullin et al. ................. 703/2 |
| 5,953,669 | A | 9/1999 | Stratis et al. |
| 5,963,867 | A | 10/1999 | Reynolds et al. |
| 5,970,406 | A | 10/1999 | Komara |
| 5,977,851 | A | 11/1999 | Stancil et al. |
| 5,986,670 | A * | 11/1999 | Dries et al. .................. 345/629 |
| 5,987,328 | A | 11/1999 | Ephremides et al. |
| 5,994,984 | A | 11/1999 | Stancil et al. |
| 6,006,021 | A | 12/1999 | Tognazzini |
| 6,018,625 | A | 1/2000 | Hayball et al. |
| 6,021,316 | A | 2/2000 | Heiska et al. |
| 6,032,105 | A | 2/2000 | Lee et al. |
| 6,038,547 | A | 3/2000 | Casto |
| 6,044,273 | A | 3/2000 | Tekinay |
| 6,058,102 | A | 5/2000 | Drysdale et al. |
| 6,058,262 | A | 5/2000 | Kawas et al. |
| 6,059,842 | A | 5/2000 | Dumarot et al. |
| 6,061,722 | A | 5/2000 | Lipa et al. |
| 6,075,541 | A | 6/2000 | Maclinovsky |
| 6,085,335 | A | 7/2000 | Djoko et al. |
| 6,088,522 | A | 7/2000 | Lee et al. |
| 6,104,699 | A | 8/2000 | Holender et al. |
| 6,108,309 | A | 8/2000 | Cohoe et al. |
| 6,111,857 | A | 8/2000 | Soliman et al. |
| 6,122,083 | A | 9/2000 | Ohta et al. |
| 6,148,010 | A | 11/2000 | Sutton et al. |
| 6,199,032 | B1 | 3/2001 | Anderson |
| 6,204,813 | B1 | 3/2001 | Wadell et al. |
| 6,208,833 | B1 | 3/2001 | Preschutti et al. |
| 6,229,540 | B1 | 5/2001 | Tonelli et al. |
| 6,236,409 | B1 | 5/2001 | Hartman .................... 345/629 |
| 6,243,772 | B1 | 6/2001 | Ghori et al. |
| 6,253,086 | B1 | 6/2001 | Parantainen et al. |
| 6,272,447 | B1 | 8/2001 | Gavin et al. .................... 703/1 |
| 6,285,377 | B1 | 9/2001 | Greenbaum et al. |
| 6,289,203 | B1 | 9/2001 | Smith et al. |
| 6,311,144 | B1 | 10/2001 | Abu El Ata |
| 6,317,599 | B1 | 11/2001 | Rappaport et al. |
| 6,326,987 | B2 | 12/2001 | Alexander |
| 6,330,005 | B1 | 12/2001 | Tonelli et al. |
| 6,337,688 | B1 | 1/2002 | Berstis |
| 6,338,031 | B1 | 1/2002 | Lee et al. |
| 6,356,758 | B1 | 3/2002 | Almeida et al. |
| 6,393,432 | B1 | 5/2002 | Flansburg et al. |
| 6,408,312 | B1 | 6/2002 | Forthman et al. |
| 6,414,679 | B1 * | 7/2002 | Miodonski et al. .......... 345/420 |
| 6,442,507 | B1 | 8/2002 | Skidmore et al. |
| 6,446,030 | B1 * | 9/2002 | Hoffman et al. ................ 703/1 |
| 6,470,195 | B1 | 10/2002 | Meyer |
| 6,487,417 | B1 | 11/2002 | Rossoni et al. |
| 6,493,679 | B1 | 12/2002 | Rappaport et al. |
| 6,496,290 | B1 | 12/2002 | Lee |
| 6,499,006 | B1 | 12/2002 | Rappaport et al. |
| 6,505,045 | B1 | 1/2003 | Hills et al. |
| 6,509,906 | B1 | 1/2003 | Awe et al. ................... 345/619 |

OTHER PUBLICATIONS

Menezes, V.M.; Paula Filho, W.P.; Oliveria, A.A.; and Lima Filho, N.C.; "A CAD system for telecommunication engineering in a GIS environment"; May-Jun. 1996; p. 1.*

Goodhead, H.D.; "The application of radio propagation prediction to spectrum management and radio network design in developing countries"; Sep. 22-24, 1992; p. 1.*

Manfred Lebherz, Werner Wiesbeck, and Wolfgang Krank; "A versatil Wave propagation Model for the VHF/UHF Range Considering Three-Dimensional Terrain"; IEEE; Oct. 1992; pp. 1121-1131.*

Yiu F. Ko, Warren R. Jones, Rupert C. Lloyd, and Robert W.A. Dobson; "A comparison of 3D Computer Propagation with GSM Signal Measurements"; IEEE; 1996; pp. 1172-1176.*

From Bird's Eye Real-time Mapping Software dated Jun. 30, 2002.

IEEE Transactions on Antennas and propagation, vol. 46, No. 8, Aug. 1998. "Effect of Terrrain on Path Loss in Urban Environments for Wireless Applications" Leonard Piazzi and Henry L. Bertoni.

P. Bahl, V. Padmanabhan, and A. Balachandran, "A Software System for Locating Mobile Users: Design, Evaluation, and Lessons," Microsoft Technical Report, Apr. 2000.

G. Durgin, T.S. Rappaport, H. Xu, Measurements and Models for Radio Path Loss and Penetration Loss in and Around Homes and Trees at 5.85 GHz, IEEE Transactions on Communications, vol. 46, No. 11, Nov. 1998.

C.M. Peter Ho et al., "Antenna Effects on Indoor Obstructed Wireless Channels and a Deterministic Image-Based Wide-Band Propagation Model for In-Building Personal Communications Systems," International Journal of Wireless Information Networks, vol. 1, No. 1, 1994.

S. Kim et al., "Radio Propagation Measurements and Predictions Using Three-dimensional Ray Tracing in Urban Environments at 908 MHZ and 1.9 GHz," IEEE Transactions on Vehicular Technology, vol. 48, No. 3, May 1999.

T.S., Rappaport et al., "Use of Topographic Maps with Building Information to Determine Antenna Placements and GPS Satellite Coverage for Radio Detection and Tracking in Urban Environments," MPRG Technical Report MPRG-TR-95-14,Virginia Tech, Sep. 1995.

R.K. Marrow, Jr. and T.S. Rappaport, "Getting In," Wireless Review Magazine, Mar. 2000.

Wireless Valley Communications, Inc., "SitePlanner 3.16 for Windows 95/98/NT User's Manual," Software User's Manual, pp. 5-148 to 5-156, 1999.

M. Panjwani et al., "Interactive Computation of Coverage Regions for Wireless Communication in Multifloored Indoor Environments," IEEE Journal on Selected Areas in Communications, vol. 14, No. 3, Apr. 1996.

L. Piazzi and H.L. Bertoni, "Achievable Acurracy of Site-Specific Path-Loss Predictions in Residential Environments" IEEE Transactions on Vehicular Technology, vol. 48, No. 3, May 1999.

T.S. Rappaport et al., "Wireless Communications: Past Events and a Future Perspective", IEEE Communications Magazine, May 2002.

T.S. Rappaport et al., "Radio Propagation Prediction Techniques and Computer-Aided Channeling Modeling for Embedded Wireless Microsystems," ARPA Annual Report, MPRG Technical Report MPRG-TR-94-12, Virginia Tech, Jul. 1994.

T.S., Rappaport et al., "Use of Topographic Maps with Building Information to Determine Antenna Placements for Radio Detection and Tracking in Urban Environments," MPRG Technical Report MPRG-TR-95-14,Virginia Tech, Nov. 1995.

D. Ullmo et al., "Wireless Propagation in Buildings: A Statistical Scattering Approach," IEEE Transactions on Vehicular Technology, vol. 48, No. 3, May 1999.

T.S. Rappapoprt, "wireless Communications: Principles and Practice" Second Edition, Prentice Hall, 2002.

T.S. Rappaport et al., "Use of Topographic Maps with Building Information to Determine AntennaPlacements and GPS Satellite Coverage for Radio Detection and Tracking in Urban Environments," MPRG Technical Report MPRG-TR-95-14, Virginia Tech, Sep. 1995.

T.S. Rappaport et al., "Indoor Path Loss Measurement for Homes and Apartments at 2.4 and 5.85 GHz," private report produced for Motorola, Dec. 16, 1997.

T.S. Rappaport, "Isolating Interference," Wireless Review Magazine, May 2000.

Slides from T.S. Rapaport and R. Skidmore, "Introduction to In-Building Wireless Systems," Infocast In-Building Wireless Solutions Conference and Exposition, Feb. 4, 2003.

S. Sandhu, M.P. Koushik, and T.S. Rappaport "Predicted Path Loss for Roslyn VA, First set of predictions for ORD Project on Site Specific Propagation Prediction," MPRG Technical Report MPRG-TR-94-20, Virginia Tech, Dec. 1994.

S. Sandhu, M.P. Koushik, and T.S. Rappaport, "Predicted Path Loss for Roslyn VA, First set of predictions for ORD Project on Site Specific Propagation Prediction." MPRG Technical Report MPRG-TR-94-20, Virginia Tech, Mar. 1995.

S. Seidel et al., "Site-Specific Propagation Prediction for Wireless In-Building Personal Communication Design," IEEE Transactions on Vehicular Technology, vol. 43, No. 4, Nov. 1994.

S. Shakkottai and T.S. Rappaport, "Research Challenges in Wireless Networks: A Technical Overview," Proceedings of the Fifth International Symposium on Wireles Personal Multimedia Communications, Honolulu, HI, Oct. 2002.

H. Sherali et al., "On the Optimal Location of Transmitters for Microcellular Radio Communication System Design," IEEE Journal on Selected Areas in Communications, vol. vol. 14, No. 3, pp. 662-673, May 1996.

R, Skidmorre et al., "A Comprehensive In-Building and Microcellular Wireless Communication System Design Tool" The Bradley Department of Electrical Engineering, MPRG-TR-97-13, Jun. 1997, Master's Thesis—unpublished by Virginia Tech for 2 years after submission.

Company Web Page "Actix" www.actix.com product name: E-NOS (now E-AMS).

Company Web Page "Agilent" www.agilent.com product name: OPAS32.

Company Web Page "Agilent" www.agilent.com product name: Wizard.

Company Web Page "Comarco" www.edx.com product name: SignalPro.

Company Web Page "ComOpt" www.comopt.com. product name: CellOpt AFP.

Company Web Page "Lucent" www.bell-labs.com product name: WiSE.

Company Web Page "Ericsson" www.ericsson.com product name: TEMS Lite.

Company Web Page "Ericsson" www.ericsson.com product name: TEMS.

Company Web Page "Marconi" www.marconi.com product name: PlaNEt.

Company Web Page "Marconi" www.marconi.com product name: decibelPlanner.

Company Web Page "Schema"www.schema.com product name: Optimizer.

Company Web Page "ScoreBoard" www.scoreboard.com product name: ScoreBoard.

R. Skidmore, et al., Russell Senate Office Building Propagation Study, Project Report for Joseph R. Loring & Associates; "Project Update," AoC Contract # Acbr96088, prepared for Office of the Architect of the Capital, Jan. 19, 1997.

R. Skidmore, et al., Russell Senate Office Building Propagation Study, Project Report for Joseph R. Loring & Associates; "Assessment and Study of the Proposed Enhancements of the Wireless Communications Environment of the Russell Senate Office Building (RSOB) and Associated Utility Tunnels," AoC Contract # Acbr96088, prepared for Office of the Architect of the Capitol, Feb. 20, 1997.

R. Torres et al., "CINDOOR: An Engineering Tool for Planning and Design of Wireless Systems in Enclosed Spaces," IEEE Antennas and Propagation Magazine, vol. 41, No. 4 Aug. 1999.

R. Skidmore et al., "Interactive Coverage Region and System Design Simulation for Wireless Communication Systems in Multi-Floored Indoor Environments: SMT Plus *tm*," IEEE ICUPC Proceedings, 1996.

T.S. Rappaport et al., "Radio Propagation Prediction Techniques and Computer-Aided CHannel Modeling for Embedded Wireless Microsystems," MPRG Tech. Report MPRG-TR-95-08, Virginia Tech, Jul. 1995.

Article titled: Building Database Manipulator Copyright Jan. 1998 by MPRG and Virginia Tech.

PCS' 97 Track 7: Engineering & Systems Management by Ted Rappaport and James S. Tucker.

Propagator vol. 8 No. 3 Summer 1997.

SMT Plus 1.0 User's Manual by Roger Skidmore and Ted Rappaport, Copyright Aug. 1996 by Virginal Tech.

Software by Andrew titled "RF Planner" dated Jun. 17, 1997.

A user guide titled "Andrew Microwave System Planner" dated Jul. 1999.

A user guide titled "Andrew Antenna System Panner" dated Jun. 1999.

* cited by examiner

Endpoint

Snaps to the closest endpoint of an entity.

FIG. 7A

Midpoint

Snaps to the midpoint of an entity.

FIG. 7B

Perpendicular

FIG. 7C

Node

Snaps to a point object
selection and snap points

Intersection

Apparent intersection

METHOD AND SYSTEM FOR USING RASTER IMAGES TO CREATE A TRANSPORTABLE BUILDING DATABASE FOR COMMUNICATIONS NETWORK ENGINEERING AND MANAGEMENT

CROSS-REFERENCE TO RELATED APPLICATIONS

This application is a divisional of U.S. Ser. No. 09/633,120, filed Aug. 4, 2000 now U.S. Pat. No. 6,721,769, which is a continuation-in-part (CIP) application of U.S. Ser. No. 09/318,841 filed May 26, 1999 now U.S. Pat. No. 6,850,946, and the complete contents of those applications are herein incorporated by reference.

BACKGROUND OF THE INVENTION

1. Field of the Invention

The present invention generally relates to database development using computer aided design and, more particularly, to manipulating data from any environment in the world (e.g. cities, buildings, campuses, floors within a building, objects in an outdoor setting, etc.) to construct an electronic building database that can be used to generate definitions of the user's building and site parameters and used with wireless communication system modeling and engineering planning products.

2. Background Description

As wireless communications use increases, radio frequency (RF) coverage within buildings and signal penetration into buildings from outside transmitting sources has quickly become an important design issue for wireless engineers who must design and deploy cellular telephone systems, paging systems, or new wireless systems and technologies such as personal communication networks or wireless local area networks. Designers are frequently requested to determine if a radio transceiver location, or base station cell site can provide reliable service throughout an entire city, an office, building, arena or campus. A common problem for wireless systems is inadequate coverage, or a "dead zone," in a specific location, such as a conference room. It is now understood that an indoor wireless PBX (private branch exchange) system or wireless local area network (WLAN) can be rendered useless by interference from nearby, similar systems. The costs of in-building and microcell devices which provide wireless coverage within a 2 kilometer radius are diminishing, and the workload for RF engineers and technicians to install these on-premises systems is increasing sharply. Rapid engineering design and deployment methods for microcell and in-building wireless systems are vital for cost-efficient build-out.

Analyzing radio signal coverage penetration and interference is of critical importance for a number of reasons. A design engineer must determine if an existing outdoor large scale wireless system, or macrocell, will provide sufficient coverage throughout a building, or group of buildings (i.e., a campus). Alternatively, wireless engineers must determine whether local area coverage will be adequately supplemented by other existing macrocells, or whether indoor wireless transceivers, or picocells, must be added. The placement of these cells is critical from both a cost and performance standpoint. If an indoor wireless system is being planned that interferes with signals from an outdoor macrocell, the design engineer must predict how much interference can be expected and where it will manifest itself within the building, or group of buildings. Also, providing a wireless system that minimizes equipment infrastructure cost as well as installation cost is of significant economic importance. As in-building and microcell wireless systems proliferate, these issues must be resolved quickly, easily, and inexpensively, in a systematic and repeatable manner.

There are many computer aided design (CAD) products on the market that can be used to design the environment used in one's place of business or campus. WiSE from Lucent Technology, Inc., SignalPro from EDX, PLAnet by Mobile Systems International, Inc., and TEMS and TEMS Light from Ericsson are examples of wireless CAD products. In practice, however, a pre-existing building or campus is designed only on paper and a database of parameters defining the environment does not readily exist. It has been difficult, if not generally impossible, to gather this disparate information and manipulate the data for the purposes of planning and implementation of indoor and outdoor RF wireless communication systems, and each new environment requires tedious manual data formatting in order to run with computer generated wireless prediction models. Recent research efforts by AT&T Laboratories, Brooklyn Polytechnic, and Virginia Tech, are described in papers and technical reports entitled "Radio Propagation Measurements and Prediction Using Three-dimensional Ray Tracing in Urban Environments at 908 MHZ and 1.9 GHz," (*IEEE Transactions on Vehicular Technology*, VOL. 48, No. 3, May 1999), by S. Kim, B. J. Guarino, Jr., T. M. Willis III, V. Erceg, S. J. Fortune, R. A. Valenzuela, L. W. Thomas, J. Ling, and J. D. Moore, (hereinafter "Radio Propagation"); "Achievable Accuracy of Site-Specific Path-Loss Predictions in Residential Environments," (*IEEE Transactions on Vehicular Technology*, VOL. 48, No. 3, May 1999), by L. Piazzi and H. L. Bertoni; "Measurements and Models for Radio Path Loss and Penetration Loss In and Around Homes and Trees at 5.85 Ghz," (*IEEE Transactions on Communications*, Vol. 46, No. 11, November 1998), by G. Durgin, T. S. Rappaport, and H. Xu; "Radio Propagation Prediction Techniques and Computer-Aided Channel Modeling for Embedded Wireless Microsystems," ARPA Annual Report, MPRG Technical Report MPRG-TR-94-12, July 1994, 14 pp., Virginia Tech, Blacksburg, by T. S. Rappaport, M. P. Koushik, J. C. Liberti, C. Pendyala, and T. P. Subramanian; "Radio Propagation Prediction Techniques and Computer-Aided Channel Modeling for Embedded Wireless Microsystems," MPRG Technical Report MPRG-TR-95-08, July 1995, 13 pp., Virginia Tech, Blacksburg, by T. S. Rappaport, M. P. Koushik, C. Carter, and M. Ahmed; "Use of Topographic Maps with Building Information to Determine Antenna Placements and GPS Satellite Coverage for Radio Detection & Tracking in Urban Environments," MPRG Technical Report MPRG-TR-95-14, Sep. 15, 1995, 27 pp., Virginia Tech, Blacksburg, by T. S. Rappaport, M. P. Koushik, M. Ahmed, C. Carter, B. Newhall, and N. Zhang; "Use of Topographic Maps with Building Information to Determine Antenna Placement for Radio Detection and Tracking in Urban Environments," MPRG Technical Report MPRG-TR-95-19, November 1995, 184 pp., Virginia Tech, Blacksburg, by M. Ahmed, K. Blankenship, C. Carter, P. Koushik, W. Newhall, R. Skidmore, N. Zhang and T. S. Rappaport; "A Comprehensive In-Building and Microcellular Wireless Communications System Design Tool," MPRG-TR-97-13, June 1997, 122 pp., Virginia Tech, Blacksburg, by R. R. Skidmore and T. S. Rappaport; "Predicted Path Loss for Rosslyn, Va.," MPRG-TR-94-20, Dec. 9, 1994, 19 pp., Virginia Tech, Blacksburg, by S. Sandhu, P. Koushik, and T. S. Rappaport; "Predicted Path Loss for Rosslyn, Va., Second set of predictions for ORD Project on Site Specific Propagation Prediction" MPRG-TR-95-03, Mar. 5, 1995, 51 pp., Virginia Tech, Blacksburg, by S. Sandhu, P. Koushik, and T. S. Rappaport. These papers and technical reports are illustrative of the state of the art in site-specific propagation modeling and show the difficulty in obtaining databases for city environments, such as Rosslyn, Va. While the above papers describe a research comparison of measured vs. predicted signal coverage, the works do not demonstrate a systematic, repeatable and fast methodology for creating an environmental database, nor do they report a method for visualizing and placing various environmental objects that are required to model the propagation of RF signals in the deployment of a wireless system in that environment.

SUMMARY OF THE INVENTION

It is therefore an object of the invention to provide a method for manipulating drawings and electronic files to build databases for use in planning the positioning of components and for designing, installing and optimizing a wireless communication system. In the method, raster scanned images of an environment may be entered or object files in various formats may be used as input to define an environment in which a wireless system is to be implemented. Detailed information about the location, radio frequency attenuation, color, and other physical information of an object, such as intersections of the object with the ground, floors, ceilings, and other objects in the environment is stored in a drawing database.

It is another object of the invention to provide a computerized drawing in a true three-dimensional environment based on input data which is strictly two-dimensional in nature. The user sees the three-dimensional drawing structure on a computer display by altering the views.

It is another object of the invention to provide the resulting database of the inventive method in a form easily used in a variety of modeling applications, especially forms useful for engineering, planning and management tools for wireless systems.

It is another object of the invention to support a universal method for creating and editing and transporting environmental databases for wireless communication system design, prediction, measurement and optimization. A systematic and automated method for producing a 3-D environmental database that is reproduceable and transportable between many different wireless system prediction models, measurement devices, and optimization methods has value and is a marked improvement over present day systems.

According to the invention, pre-existing data for a desired environment may be scanned in, traced or translated from another electronic format as a short-cut to provide a partial definition for the environment. The partial or empty environment is then refined using a specialized drawing program to enter, entities and objects that fully define the environment in terms of floors, partitions, obstructions, and other data required for engineering planning of a wireless communications network in the environment. The input data are generally two dimensional (2D) representations of the environment. When ceiling height, elevation above sea level, or partition height data is entered, the drawing may then automatically be viewed in three-dimensions (3D). This 3D representation enables the design engineer to visually verify any parameters incorrectly entered. The definition of the environment, or drawings, maps or other data are verified and the design engineer is automatically prompted to enter missing or inconsistent information. Once the drawing(s) have been verified, the data defining the environment may be used by a variety of tools, models, wireless propagation prediction methods, measurement products or optimization procedures that require information about an environment's terrain levels, physical make up, and specific location of floors, walls, foliage or other obstruction and partition structures. Anything that impedes or otherwise affects the propagation of radio wave energy must be considered when predicting the performance of a wireless communication system in the environment, and the present methodology provides a simplified mechanism for collecting and editing this information in a readily usable form. The method for constructing and manipulating an indoor or outdoor environment is useful not only for wireless communication designers, but may also be useful for other applications, as well.

BRIEF DESCRIPTION OF THE DRAWINGS

The foregoing and other objects, aspects and advantages will be better understood from the following detailed description of a preferred embodiment of the invention with reference to the drawings, in which:

FIGS. 7A through 7F show examples of methods for snapping an object to a grid, or other desired location on a drawing;

DETAILED DESCRIPTION OF A PREFERRED EMBODIMENT OF THE INVENTION

The present invention is used to build databases for use with modeling and engineering planning and automated design products. The current embodiment permits repeatable, reproduceable computer representation that may be transported or exported into many standard file formats and is designed specifically for use with the SitePlanner suite of products available from Wireless Valley Communications, Inc. of Blacksburg, Va. However, it will be apparent to one skilled in the art that the method could be practiced with other products either now known or to be developed in the future. (SitePlanner is a trademark of Wireless Valley Communications, Inc.)

Figure 1:
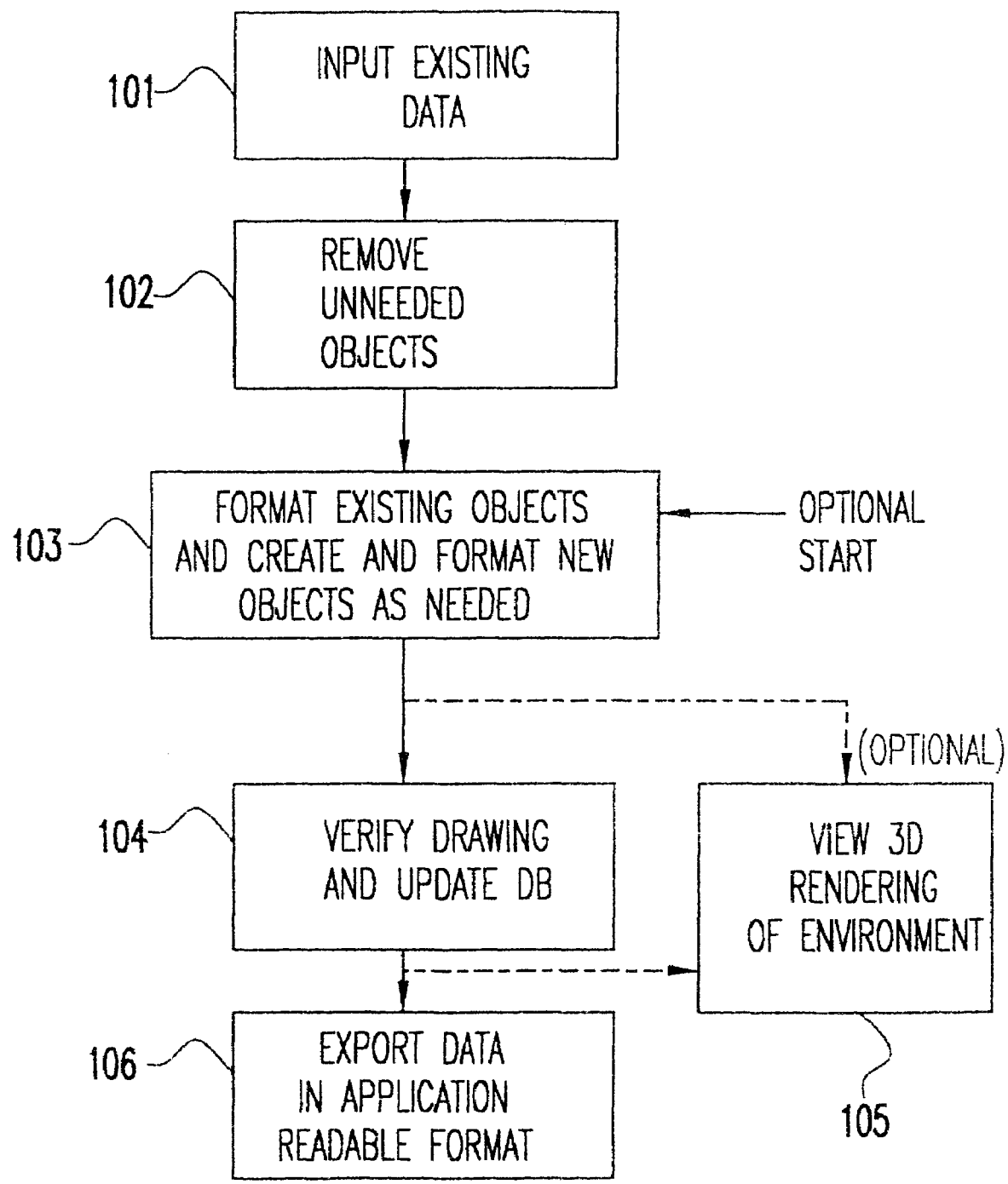
FIG. 1 is a flow diagram of the general method of the invention.

Referring now to the drawings, and more particularly to FIG. 1, there is shown a flow diagram for the method of the present invention. In order to build a specially formatted database that contains data necessary and sufficient for input into an engineering model, a definition of the desired environment must first be built. First, existing data is entered into the system database in function block 101. This data may be in a variety of formats, as described in detail later. Because this existing data may be in a format which embodies unnecessary additional data, legends, map layers or text, unneeded objects are removed from the database in function block 102. The existing objects are then formatted and embellished with additional information in function block 103. Objects may include simple lines, representing walls or the sides of buildings or they may be polygons or polylines which represent trees, foliage, buildings, or other obstructions. An arbitrary number of objects may be drawn, traced, or moved using CAD commands which have a specific representation. In the preferred embodiment, each object or the group of objects saved in a file format known as ".DWG" which is developed by AutoDesk, Inc. However, it would be apparent to one skilled in the art how to practice this invention with other applications and tools using other formats. If additional objects are needed to describe the environment, they are also added to the database here. In the event that there is no pre-existing data, and the database must be built from scratch, the process may begin at this point, skipping steps 101 and 102.

Once the data has been entered, the user may optionally display the 2D data as a 3D representation in function block 105. The 3D view can be displayed at any time after entering height data, at the user's discretion.

Once the user has entered all of the data, a verification of the drawing may be performed in function block 104. At this point the process does a step-by-step analysis of the environment defined in the database to determine whether any data is missing. The invention provides an interactive feedback to the engineer and prompts the user as to where scaling and alignment are required, etc. While the preferred embodiment is described in detail, it should be evident to one skilled in the art that alternative methods such as totally automated verification may be possible. Because any engineering planning tool requires a specific set of information to operate optimally and efficiently, verification is important. The user is prompted to affirmatively declare that each piece of desired data has been entered and verified for proper format. If there are missing data, the user may then return to step 103 to enter additional necessary objects before running the verification procedure in function block 104, again. This step provides automatic verification guidance and prompts the user with feedback.

Once the drawing has been verified, the data is stored in the database in function block 106 or can be exported for use in an application that does not read directly from the database. This specially formatted data includes all information necessary to describe the building, site or campus environment.

While the above description generally describes the method of the invention, a more detailed description follows. The current embodiment, Building Database Manipulator (BDM), has been designed to operate integrally with the SitePlanner suite of products. Therefore, a detailed example of how each step is performed will use this embodiment as a foundation for discussion. However, it should be understood that the BDM could be used with other wireless communications propagation models (e.g. ray-tracing models or statistical models), other wireless prediction tools (e.g., Lucent Technologies WiSE, EDX SignalPro™, Ericsson TEMS, MSI PLAnet), or measurement tools now available (e.g., a wireless LAN transceiver, a spectrum analyzer, or any wireless measurement device such as a ZK Celltest 836 or a Berkeley Varitronics Champ receiver), or developed in the future. (BDM is a trademark of Wireless Valley Communications, Inc. SignalPro is a Trademark of EDX. PLAnet is a trademark of Mobile Systems International.)

Figure 2:
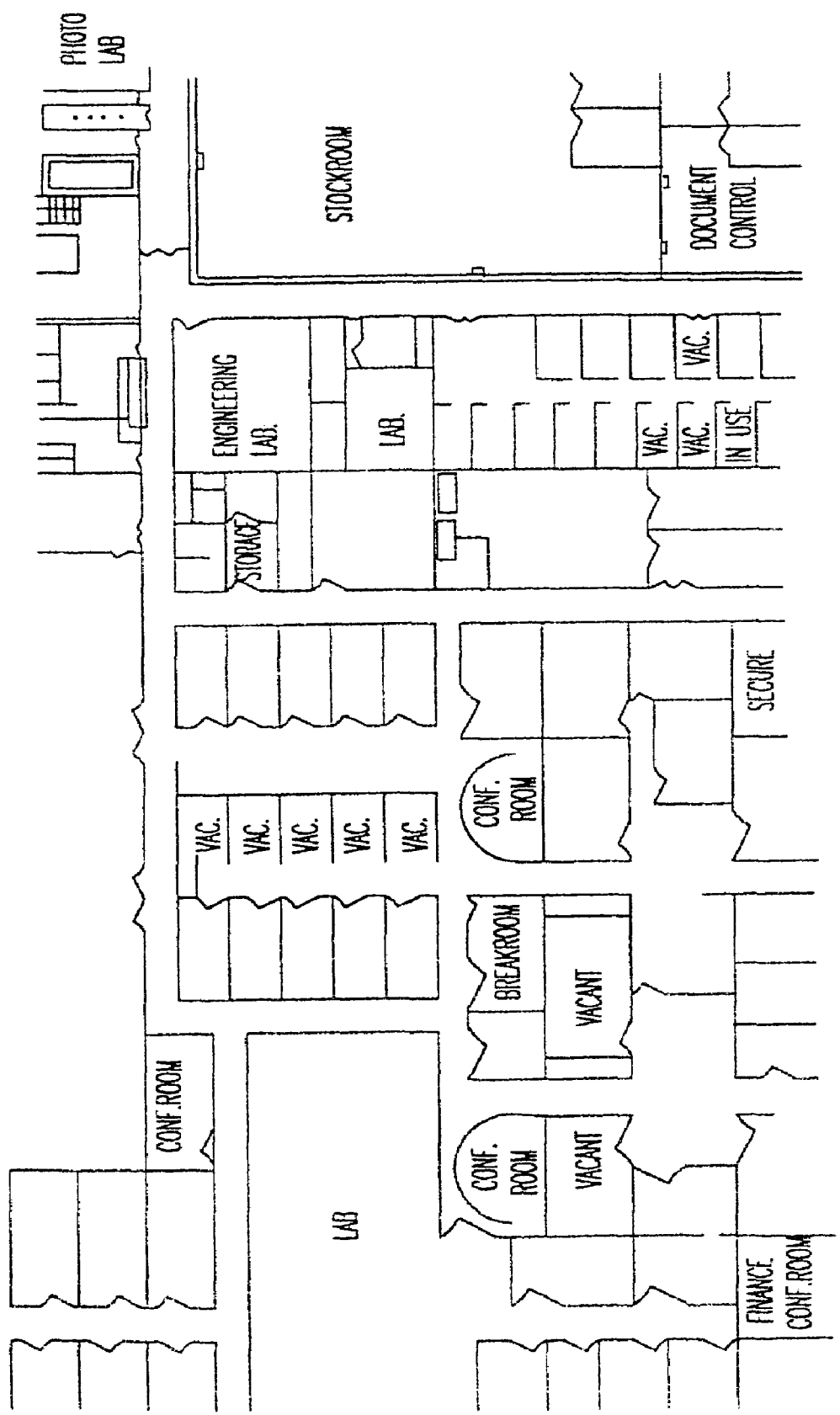
FIG. 2 is a representation of a typical building floor plan.

Wireless prediction modeling software will typically utilize a site-specific database format, meaning that the database is specific to the area/environment it represents. This database can be thought of as being a collection of buildings and terrain, properly scaled and positioned in three-dimensional (3D) space relative to one another. In turn, each building is a collection of the floors that it houses (e.g., a nine story building has nine floors). FIG. 2 shows a typical building floor plan as it may be entered into the database. Each floor is a collection of obstructions/partitions. An obstruction/partition is anything that impedes or otherwise affects the propagation of radio wave energy, and thus must be considered when predicting the performance of a wireless communication system in the environment. For example, concrete walls, brick walls, sheetrock walls, doors, windows, large filing cabinets, and many others are all obstructions/partitions. At the same time, a large crowd of people, varying terrain, or foliage could also be considered obstruction/partitions.

The SitePlanner products, specifically, utilize a specially formatted vector database format, meaning that it consists of lines and polygons rather than individual pixels (as in a raster format). The arrangement of lines and polygons in the database corresponds to obstructions/partitions in the environment. For example, a line in the database could represent a wall, a door, or some other obstruction/partition in the modeled environment.

Obstructions/partitions are classified into categories. The user may define different categories of obstructions/partitions. A category is defined by a textual description (e.g., "External Brick Walls"), a vertical height (i.e., how tall is the wall), a color (to quickly distinguish it from entities belonging to other categories while viewing the drawing), and electromagnetic properties (discussed in further detail later). The category to which a given drawing entity (where an entity is either a line or polygon) has been assigned defines the type of obstruction/partition it represents. For example, if a given line has been assigned to the user-defined category of "Sheetrock Walls," then it shares the characteristics given by the user to all other entities within that category throughout the entire database drawing. The process of either creating new entities or changing the category to which the entity belongs is a simple point-and-click process using a mouse or other positioning device, by linking entities to a particular user defined category of partitions. The preferred embodiment allows the physical, electrical, and aesthetic characteristics of entities of the same category to be individually or collectively edited. Category designation is carried out by assigning a particular numerical value to the field of each entity, wherein the field is specified as part of the drawing database.

From the standpoint of radio wave propagation, each obstruction/partition in an environment (i.e., each entity in the drawing, or the equivalent thereof), has several electromagnetic properties that directly affect it. When a radio wave signal intersects a physical surface, several things occur. A certain percentage of the radio wave reflects off of the surface and continues along an altered trajectory. A certain percentage of the radio wave penetrates through the surface and continues along its course. A certain percentage of the radio wave is scattered once it strikes the surface. The electromagnetic properties given to the obstruction/partition categories, when used in conjunction with known electromagnetic theory, define this interaction within the environment. Each category has parameters that include an attenuation factor, surface roughness, and reflectivity. The attenuation factor determines the amount of power a radio signal loses when it penetrates through an entity of the given type. The reflectivity determines the amount of the radio signal that is reflected from the entity (as opposed to penetrating through it). The surface roughness provides information used to determine how much of the radio signal is scattered upon striking an entity of the given type.

As mentioned above, the parameters given to each category fully define the entities contained within it. Altering the parameters of a category directly affects all entities assigned to it. This greatly simplifies the tedium of database creation for site-specific modeling.

The method used to predict and optimize antenna positioning in a desired environment uses a number of models, such as those described in the papers: "Interactive Coverage Region and System Design Simulation for Wireless Communication Systems in Multi-floored Indoor Environments, SMT Plus," *IEEE ICUPC '96 Proceedings*, by R. R. Skidmore, T. S. Rappaport, and L. Abbott: "Achievable Accuracy of Site-Specific Path-Loss Predictions in Residential Environments," (*IEEE Transactions on Vehicular Technology*, VOL. 48, No. 3, May 1999), by L. Piazzi and H. L. Bertoni (hereinafter "Achievable Accuracy"); "Wireless Propagation in Buildings: A Statistical Scattering Approach," (*IEEE Transactions on Vehicular Technology*, VOL. 48, No. 3, May 1999), by D. Ullmo and H. U. Baranger; "Site-Specific Propagation Prediction for Wireless In-Building Personal Communication System Design," (*IEEE Transactions on Vehicular Technology*, VOL. 43, No. 4, November 1994), by S. Y. Seidel and T. S. Rappaport; "Antenna Effects on Indoor Obstructed Wireless Channels and a Deterministic Image-Based Wide-Band Propagation Model for In-Building Personal Communication Systems," (*International Journal of Wireless Information Networks*. Vol. 1, No. 1, 1994), by C. M. P. Ho, T. S. Rappaport and M. P. Koushik; and "Interactive Computation of Coverage Regions for Wireless Communication in Multi-floored Indoor Environments," (*IEEE Journal on Selected Areas in Communication*, Vol 14, No. 3, April 1996), by M. A. Panjwani, A. L. Abbott and T. S. Rappaport; "Measurements and Models for Radio Path Loss and Penetration Loss In and Around Homes and Trees at 5.85 Ghz," (*IEEE Transactions on Communications*, Vol. 46, No. 11, November 1998), by G. Durgin, T. S. Rappaport, and H. Xu, and previously cited references, all of which are hereby incorporated by reference. Some simple models are also briefly described in "SitePlanner 3.16 for Windows 95/98/NT User's Manual" (Wireless Valley Communications, Inc. 1999), hereby incorporated by reference. It would be apparent to one skilled in the art how to apply other models to this method.

In order to build a database that can be used in site-specific modeling, as done, for instance, in SitePlanner, or in equivalent programs now known or later developed, or similarly in other applications, one can either build each entity from scratch or start with a full or partial definition of the environment in some format. The present invention offers many solutions to ease the incorporation of previously drawn or scanned images of building floor plans to accomplish step 101 of the method, as shown in FIG. 1. A wide variety of pre-existing formats such as a paper map, an electronic map, a blueprint, and existing CAD drawing, a bitmap image, or some other representation, are used to obtain environmental information. Most commonly, this information is available in some form of electronic building blueprint or map information and in the case of buildings, is often supplied one floor at a time. That is, a building blueprint usually involves a separate blueprint or other piece of information for each building floor. Two possible formats for this information are raster and vector. The present invention extracts environmental data from both formats. One skilled in the art would see how both raster and vector data (e.g., USGS raster terrain data with vector building overlays) could be combined using the present invention.

Figure 3:
FIG. 3 is a representation of a raster image of a house.

Raster drawings or maps are collections of individually colored points (or "pixels") that, when viewed as a whole, form a picture representation of the environment. FIG. 3 shows a photograph of a house 10 made up of a series of colored pixels to represent the appearance of a house (appearing here in black and white). A raster image or map references the pixels in a specific grid rather than vectors. Therefore, raster images do not contain detailed information about objects.

The present invention allows raster images to be copied, moved, or clipped. Using the present invention, one can modify an image with grip modes, adjust an image for contrast, clip the image with a rectangle or polygon, or use an image as a cutting edge for a trim. Examples of raster formats processed by the preferred embodiment of the present invention include, but are not limited to, Windows Bitmaps (BMP), Joint Photographic Experts Group format (JPEG), Graphical Interchange Format (GIF), Tagged-Image File Format (TIFF), Targa format (TGA), PICT, and Postscript. Raster drawings of any type may be converted into vector drawings, or other vector data based representations. The process involves using the imported raster drawing (which is really just an image) as a backdrop, and then tracing over it with a mouse or other positioning device, and adding new entities (lines and polygons), to generate a formatted database/drawing.

Vector drawings are collections of individual lines and polygons. Examples of vector formats include AutoCAD drawing files (DWG), Autodesk Drawing Exchange files (DXF), and Windows Metafiles (WMF). Because vector drawings already consist of lines and polygons, converting them into a format used by the present invention is straightforward. In the preferred embodiment, vector drawings are converted into BDM format drawings by simply loading them, selecting lines and/or polygons within the drawing, and then assigning the selected entities to a given category.

When using pre-existing data formats, it is probable that the map or drawing will contain information that is unneeded for the modeling and prediction steps. Therefore, one should remove unneeded objects from the drawing, as shown in step 102 of FIG. 1.

In addition to importing images and drawings, a collection of commands that permit users to draw new floor plans to accomplish step 103 of the method is provided. Multiple floor plans may be combined into three-dimensional, multi-floored drawing databases for use in the method, also in step 103.

During the process of creating and formatting building databases, one may view the current drawing in 3D, as shown in step 105 of FIG. 1. Each obstruction/partition category has an associated height parameter that defines the vertical dimension of each entity in the given category. By creating a new entity of a given category or converting an entity from or between categories, the vertical dimension of the new entity is automatically adjusted to match that specified for the category. Thus, if the invention processes a 2D vector drawing (i.e., a drawing with individually selectable lines and polygons), selecting an entity and assigning it to a given category carries out the conversion between 2D and 3D automatically. If the invention processes a raster drawing (i.e., a bitmap or similar format drawing that consists of individual colored pixels), the drawing can be imported and "traced over", where with the creation of each new entity, the category again defines the vertical dimension given to the entity.

Each building floor can itself be thought of as a category that encapsulates the obstruction/partition categories defined by the user. Each floor of a building has an associated ceiling height. Alternatively, entire buildings may be represented with a building height. For the case of a multifloor building, the ceiling heights given to each floor in a building defines the vertical separation between them. Thus, the ceiling height parameter of a given floor is used to correctly position, vertically in space, each entity located on the floor relative to the entities located on other floors of the building.

Once the height of a given obstruction/partition category and/or the ceiling height of a given floor is adjusted, the 3D structure or the drawing database is altered automatically, as appropriate. This is a major improvement over other 3D techniques simply from a speed and ease of use point of view. It is much easier to construct a building in 2D using lines and polygons whose vertical dimension is handled automatically, as in the present invention, than to model the same building in 3D using slanted or vertical planes, as is done in other systems, such as suggested in the "Radio Propagation" and "Achievable Accuracy" papers, cited above. The 3D view enables the user to verify the building structure (i.e., that the vertical dimension of an obstruction/partition category has not been inadvertently specified incorrectly) and provides a unique perspective that is ultimately useful when viewing wireless prediction or measurement data for evaluation of the performance of the communication system being modeled.

Once an environment has been specified and defined as objects, and a visual verification of the 3D drawing is complete, a full verification of this definition is performed in step 104, as shown in FIG. 1. The engineer or designer selects the Final Drawing Check procedure to ensure that all of the steps necessary to create a fully functional model of the desired building environment have been correctly performed. These steps include ensuring that the modeled environment is properly scaled and that the separate floors of the building are visually aligned in 3D space. Certain drawing structures and information can also be automatically detected. For example, the number of floors in a given building, the number and types of obstruction/partition categories and the entities assigned to each type, whether or not the user has already verified the drawing previously, and what (if any) activity has been done to the drawing database by the other SitePlanner-tool suite members can be automatically detected and reported to the user.

To obtain wireless system performance predictions using data generated with the present invention, as disclosed in the co-pending application Ser. Nos. 09/318,842 and 09/318,840, one preferably uses the present method for the preparation of building databases. Depending on the chosen wireless system propagation or performance prediction model, important information is needed such as physical distances, partition locations, floor locations, and the numbers of floors and partitions. Standard architectural drawings, like scanned images, do not contain the necessary database information. Therefore, building a verified database for use in the selected wireless system propagation or performance prediction model is essential to ensure the best results.

Computer Aided Design (CAD) programs create vector graphics, made of lines and curves defined by mathematical objects called vectors. Vectors describe graphics according to their geometric characteristics. For example, a wheel in a vector graphic is made up of a mathematical definition of a circle drawn with a certain radius, thickness, color, and specific location. A user can move, resize, or change the color of the wheel without losing the quality of the graphic.

The present invention utilizes the vector information of imported maps, drawings or electronic images and file formats, as well as information input by users, to build complex 3-D representations and vector based databases. The preferred embodiment utilizes the drawing commands from AutoCAD, a product of AutoDesk, Inc. of San Rafael, Calif. It would be apparent to one skilled in the art that any other vectorized drawing tool, either now known or to be invented could be used as an alternative in the practice of the present invention. The process of inputting and converting the environmental information into a database is referred to as formatting. The present invention facilitates the formatting of objects in a drawing, and also stores detailed information in the drawing database about the object's location, attenuation factor, color, and other physical and electrical information such as reflectivity, or intersections of the object with floors, ceilings, and other objects.

The present invention may scan and format environmental information if a vector drawing of the environment does not exist. If formatted vector drawings do exist, the method of the invention provides many ways for these drawings to be formatted into a useful format. Generally, two "starting points" exist when working with vector drawings. These starting points are briefly discussed in the following bulleted list.

Starting with a previously drawn (CAD) floor plan, and
Starting from scratch.

In order to create a vectorized drawing of a desired environment, it is desired to utilize a number of drawing tools. The present method provides the user with a wide range of commands which have been crafted for rapid database creation and manipulation, as described below. Many of these commands rely on specific combinations of AutoCAD drawing commands which are sequentially executed without the user having to know the specific CAD commands. It should be apparent to one skilled in art that the method for creating drawings, as described below, could be practiced with other products either now known or to be developed in the future.

View Formatted Information command—This command invokes a list box that contains a list of formatted floors in a drawing.

Hide Formatted Information command—This command allows a user to hide partitions that have been previously formatted.

View Unformatted Information command—This command works in a similar manner as the View Formatted Information command.

A list box of available layers in the drawing that are not formatted layers is displayed.

Toggle Orthogonal Draw On/Off command—With the default cursor snap setup, ORTHO mode (ON) constrains cursor movement to horizontal and vertical directions (90 degrees).

Display Grid command—This command allows the user to specify grid spacing, or to turn on/off snap and aspect options. It also allows the user to specify the spacing value between grid lines. The user may turn the grid on or off.

Snap—Sets the grid spacing to the current snap interval.
Aspect—Sets the grid to a different spacing in X and Y directions.

Cursor Snap command—This command prompts the user with "Snap spacing or ON/OFF/Aspect/Rotate/Style <0.5000>:"

Spacing—Activates Snap mode with the specified value.
ON—Activates Snap mode using the current snap grid resolution, rotation, and style.
OFF—Turns off Snap mode but retains the values and modes.
Aspect—Specifies differing X and Y spacing for the snap grid. This option is not available if the current snap style is Isometric.
Rotate—Sets the rotation of the snap grid with respect to the drawing and the display screen. The user specifies a rotation angle between −90 and 90 degrees. A positive angle rotates the grid counterclockwise about its base point. A negative angle rotates the grid clockwise.

Base point <current>: The user specifies a point

Rotation angle ~current>: The user specifies an angle

Style—The user specifies the format of the Snap grid, which is standard or isometric.

Standard—Displays a rectangular grid that is parallel to the XY plane of the current Universal Coordinate System of the drawing database. X and Y spacing may differ.

Isometric—Displays an isometric grid, in which the grid points are initially at 30- and 150-degree angles. Isometric snap can be rotated but cannot have different Aspect values.

Object Selection Snap command—This command allows the user to select points in the drawing. One should note that when more than one check box option is selected, the invention applies the selected snap modes to return a point closest to the center of the aperture box.

Figure 7D:
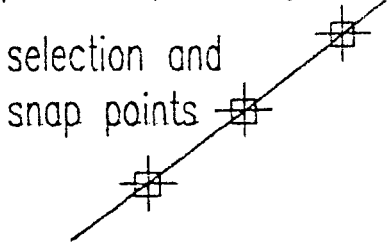
Figure 7E:
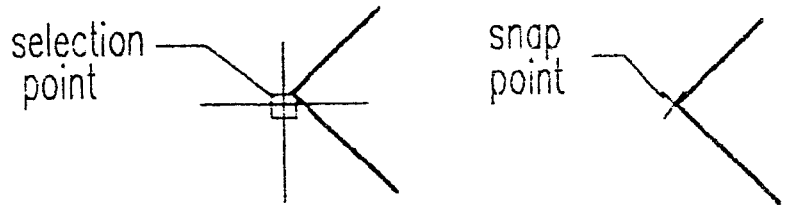

The Snap procedure is especially useful in drawing the floors of the environment when tracing raster images and drawing from scratch. FIGS. 7A through 7F illustrate the various snapping procedures which are used by AutoCAD and known to those skilled in the art. For instance, the Endpoint option snaps to the closest endpoint of an entity as shown in FIG. 7A. The Midpoint option snaps to the midpoint of an entity as shown in FIG. 7B. The Perpendicular Node Nearest Intersection option snaps to a point perpendicular to an entity as shown in FIG. 7C. The node option snaps to a point object as shown in FIG. 7D. The Nearest option snaps to the nearest point on an entity. The Intersection option snaps the intersection of two or more entities as shown in FIG. 7E. The Apparent Intersection option includes two separate snap modes: Apparent Intersection and Extended Apparent Intersection. The user can locate Intersection and Extended Intersection snap points while running Apparent Intersection object snap mode.

Figure 7F:
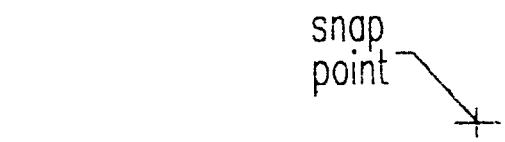
Figure 7F:
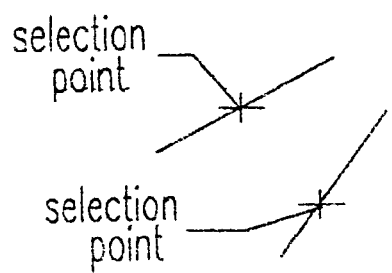

Apparent Intersection snaps to the apparent intersection of two entities that do not intersect in 3D space, but might appear to intersect onscreen. Extended Apparent Intersection snaps to the imaginary intersection of two objects that would appear to intersect if the objects were extended along their natural paths, as shown in FIG. 7F.

The Quick option snaps to the first snap point on the first object found. Quick must be used in conjunction with other object snap modes.

Other useful commands are described below:

Show Distance Between Points command—This command prompts the user to select two points in a drawing, after which the distance the points are display.

Break/Ungroup Entities command—This command allows the user to ungroup and break apart objects.

Purge command—In addition to the graphic objects used by the present method, there are several types of non-graphical objects that are stored in drawing files. These objects have descriptive designations associated with them; for example blocks, layers, groups, and dimension styles. In most cases the user names objects as they are created, and they can later be renamed. Names are stored in symbol tables. When a named object is specified on the command line or selected from a dialog box, the name and associated data of the object is referenced in the symbol table. Unused, unreferenced named objects can be purged from a drawing at any time during an editing session. Purging reduces drawing size, and therefore, the memory requirements for working with the drawing. Objects that are referenced by other objects cannot be purged. All objects may be purged at once, or the user can select a category of object to purge such as: Linetypes, Text Styles, Dimension Styles, Multiline Styles, Blocks, and Shapes.

Drawing Utilities command—This command allows the user to audit the drawing or recover from a corrupted drawing.

Alternately, the invention supports automated processing of CAD drawing files to generate a 3-D environmental model. This functionality utilizes layers that are specified within the CAD drawing file to automatically convert the graphical entities defined within the CAD file to three-dimensional partitions/obstructions within the 3-D environmental model of the facility. Layers are collections of graphical drawing entities that have been grouped by an architect or other CAD user to serve some descriptive purpose regarding the facility. For example, all windows in a CAD drawing file of a facility could be grouped on a certain layer, while all the doors of a facility could be grouped onto a different layer. By referencing a layer that is defined in a CAD file, all entities that are grouped to form that layer are also referenced. Therefore, layers enable quick access to entities that may be similar in function within a CAD drawing file. Textual labels denote different layers; therefore, all layers in a CAD drawing file must have unique textual labels assigned to them. For example, all windows in a CAD drawing file may be grouped on layer "Windows", whereas all doors may be grouped on layer "Doors". By referencing the textual label given to a layer, a CAD user may automatically reference all of the individual graphical entities that comprise the layer.

Although the given description of layers describes the implementation of collections of graphical entities within AutoCAD®, a popular CAD software tool now available, one skilled in the art would understand that collections of graphical entities in CAD drawing files other than AutoCAD® files could be utilized in a similar fashion. The present invention includes functionality that utilizes layers within a CAD drawing file to automate the processing to convert the CAD drawing file into a 3-D environmental model of a facility. The process includes the ability to automatically convert all graphical entities that are grouped onto a given layer within a CAD drawing file into three-dimensional partitions/obstructions within the 3-D environmental model. This is very advantageous as it eliminates the need to individually select the graphical entities that comprise the given layer. Instead, by identifying the layer the desired action is applied to all graphical entities that comprise the layer. In addition to automatically processing all graphical entities comprising a selected layer into their three-dimensional partition/obstruction counterparts within the 3-D environmental model, the designer may elect to automatically delete all graphical entities on a given layer, or change the visibility of the entities on a given layer.

Figure 8:
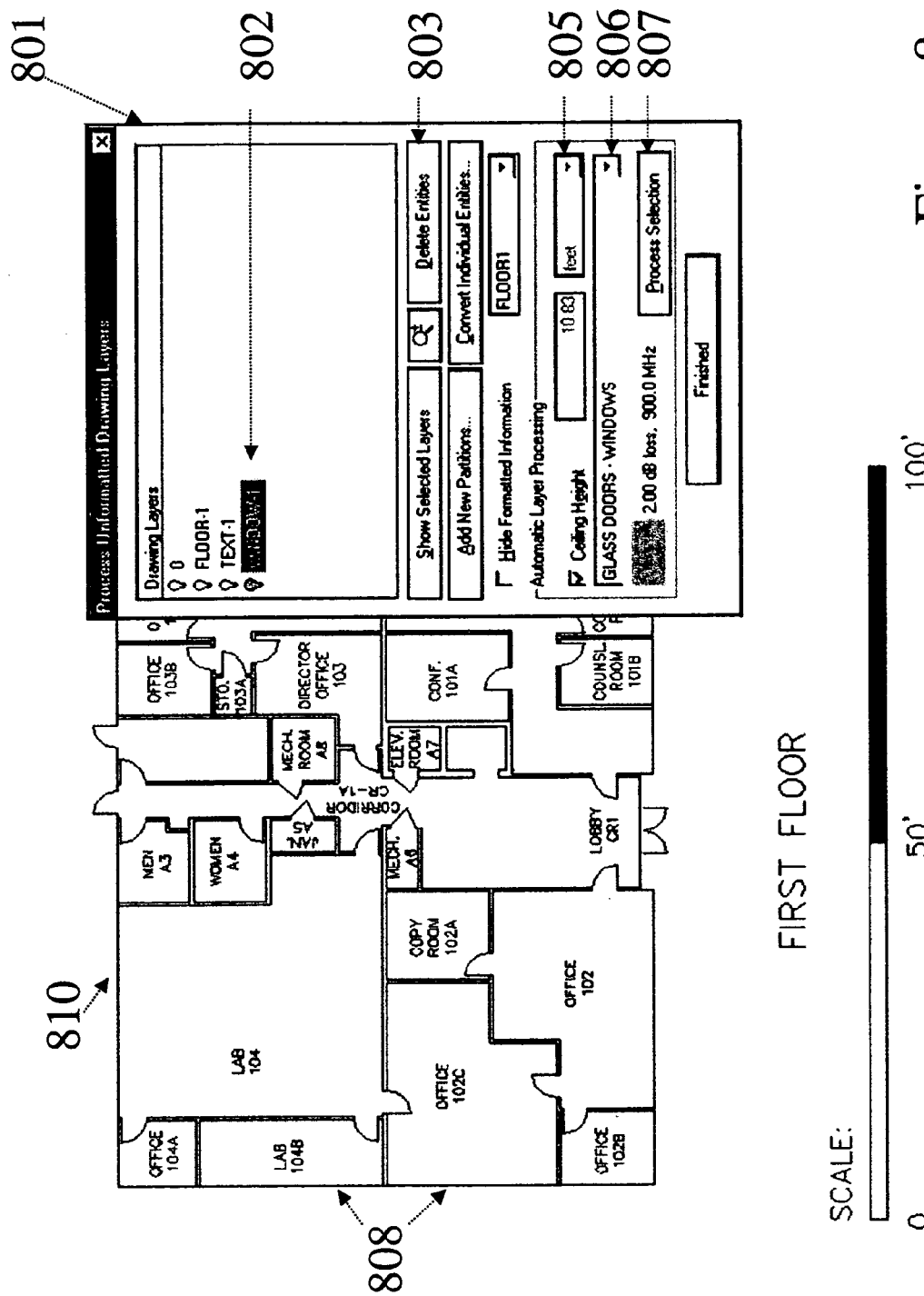
FIG. 8 is a schematic drawing of a computer dialog window illustrating the layers contemplated by this invention.

The automated processing of graphical entities that have been grouped into layers in CAD drawing files is available in the present invention by accessing pull-down menus and commands. Computer dialog windows are displayed that manage the automatic processing of the drawing layers in a CAD file. Referring to FIG. 8, there is shown the computer dialog window 801 as implemented in the preferred embodiment of the invention. A simplified CAD drawing file 810 of the first floor of a building is displayed behind the computer dialog box 801. Although the CAD drawing file displayed in FIG. 8 is of a single floor of a building, one skilled in the art could see how much more complex building structures that include multiple floors, terrain, or any other physical structure could be represented. The CAD drawing file in FIG. 8 contains four layers, named "0", "Floor-1", "Text-1", and "Window-1." These are displayed in the computer dialog box 802 and are available for the designer to select. The designer is free to select one or more of the layers from the list, as shown in FIG. 8. Once one or more layers are selected, the designer can perform several functions on the graphical entities that belong to the selected layers. In FIG. 8, the "Windows-1" layer has been selected. Several of the graphical entities in the drawing file 808 belong to the "Windows-1" layer. By selecting the Delete Entities button 803, the designer can automatically erase all entities belonging to layer "Windows-1". Alternately, by selecting the Process Selection button 807, the designer can automatically convert all entities belonging to layer "Windows-1" into a selected category of partition/obstruction. The choice of partition/ obstruction category is selected by the designer using the pull-down list 806, and the height of the partition/obstruction is selected by the designer using the edit box 805. Using the mouse or other computer pointing device, the designer selects one or more layers 802, selects a certain partition/obstruction category 806, identifies a height 805, and then selects the Process Selection button 807. The preferred embodiment of the invention then automatically converts all graphical entities belonging to the selected layers into partitions/obstructions of the selected category 806 and selected height 805. In FIG. 8, all graphical entities 808 belonging to the selected layer "Windows-1" would be converted into partitions/obstructions of type "Glass Doors and Windows" 805 and each would be set to be 10.83 feet tall 806. Many variations on this concept can be practiced within the ambit of this invention.

Figure 9:
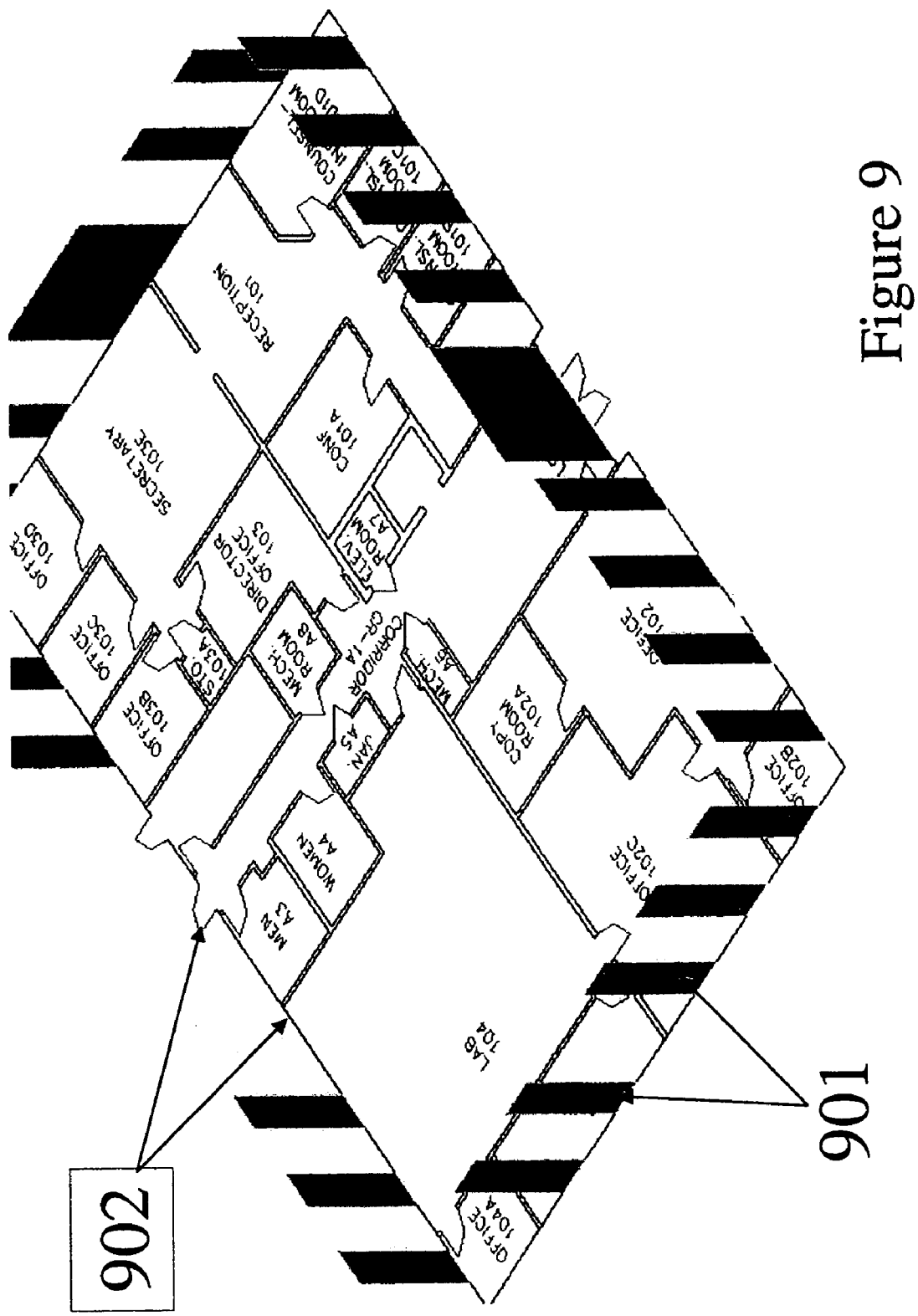
FIG. 9 is a schematic drawing, in 3-D, of the same CAD file shown in FIG. 8 following the automatic processing of groups of objects in any one layer according to this invention.

Referring now to FIG. 9, there is shown the same CAD file as shown in FIG. 8 following the automatic processing of all graphical entities on layer "Windows-1". The graphical entities that comprised layer "Windows-1" have been replaced with 3-D obstructions 901 whose height, attenuation, reflectivity, and other electromechanical and aesthetic properties correspond to those of the "Glass Doors-Windows" category of 3-D environmental partitions/obstructions selected during the process discussed above and using the computer dialog box shown in FIG. 8. In FIG. 9, the remaining graphical entities 902 have not been altered as they did not belong to layer "Windows-1". The designer is free to repeat the process in similar fashion for other CAD file layers to continue developing the 3-D environmental model of the facility.

This functionality represents a dramatic improvement over prior art by rapidly enabling the conversion of CAD drawing files into three-dimensional representations of any given environment suitable for use in the prediction of wireless communication system performance.

Figure 4:
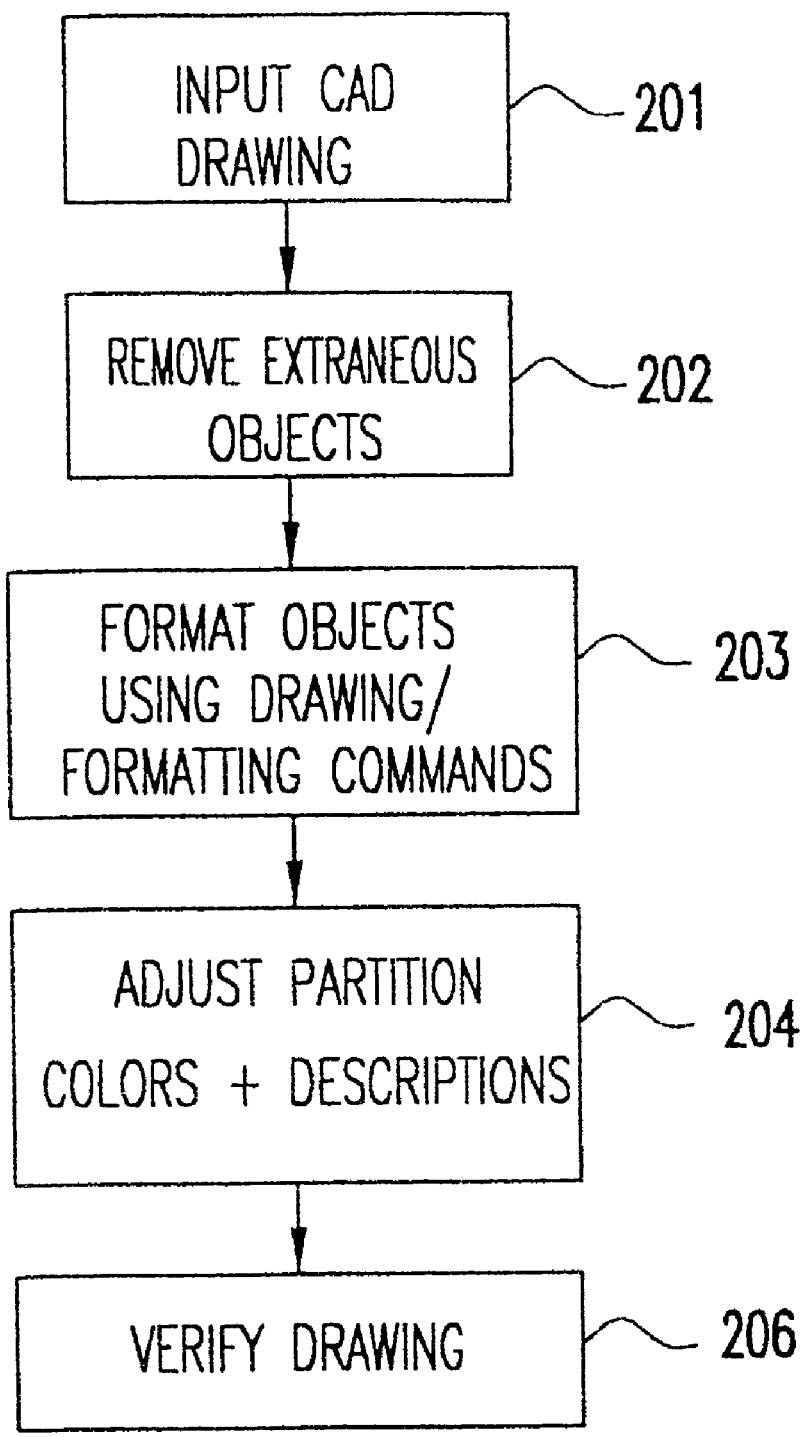
FIG. 4 is flow diagram of a method for generating drawings from pre-existing computer aided design (CAD) drawings.

Referring now to FIG. 4, if the user starts with a previously drawn CAD drawing, the following steps outline typical procedures for formatting drawings. Methods for implementing this outline are discussed below.

First, the CAD drawing is input in function block 201. The user then decides what extraneous drawing objects to remove (e.g., doors, labels, borders, drawing scales, stairs, etc.) in function block 202. Remaining objects are formatted using drawing commands, as described above, in function block 203. Partition colors and descriptions are adjusted, as desired in function block 204. After formatting all objects, the drawing is verified in function block 206.

In the preferred embodiment, verification is an automated sequential process that takes the user through a series of procedures, as listed below, to determine that all necessary data has been entered consistently. In alternative embodiments, the order of the procedures and functions of each procedure can be altered, merged, expanded, modified, or even omitted depending on the judgment of one skilled in the art. The verification process can also be fully automated, without requiring user interaction. The preferred embodiment currently provides for the following steps:

Scale Drawing is used to scale a drawing to the proper size based on the known size of a particular object in the drawing.

Align Building Floors assists in aligning floors in a drawing after the different floors have been assembled in the drawing.

Ceiling Height allows the user to adjust the heights of ceilings in either meters or feet.

Set Partition Labels and Colors permits the user to set and modify the partition labels and the colors of the partitions. The height may also be modified. If the partitions already exist in a drawing, the user can use this command to globally change the color of partitions or the partition's name.

Set Origin of Building Coordinate System allows the user to specify a reference point which to be stored in the drawing database. This point is important for assembling drawings so that the point can automatically align the drawings.

Set Environmental/Path Loss Parameters allows modification of partition labels, path loss parameters, and electrical characteristics such as attenuation parameters.

Create Boundary creates an invisible boundary around a drawing to guide the predictive models so that the predictions/calculations are reasonably bounded in the space within the database.

Create Legend allows the user to enter pertinent information about a drawing, and gives the user options to size the legend relative to the current window and options to add additional information to the legend such as a partition color legend, a contour color legend, and a measurement data color legend.

The Remove-Purge Unnecessary Drawing Information command must be selected manually to ensure appropriate purging of unused drawing objects.

If the format definition of the database is modified, it would be apparent to one skilled in the art how to change the method of verification to accommodate these modifications. It would also be apparent to one skilled in the art how to modify and extend existing drawing or CAD packages to perform the method of the invention.

Figure 5:
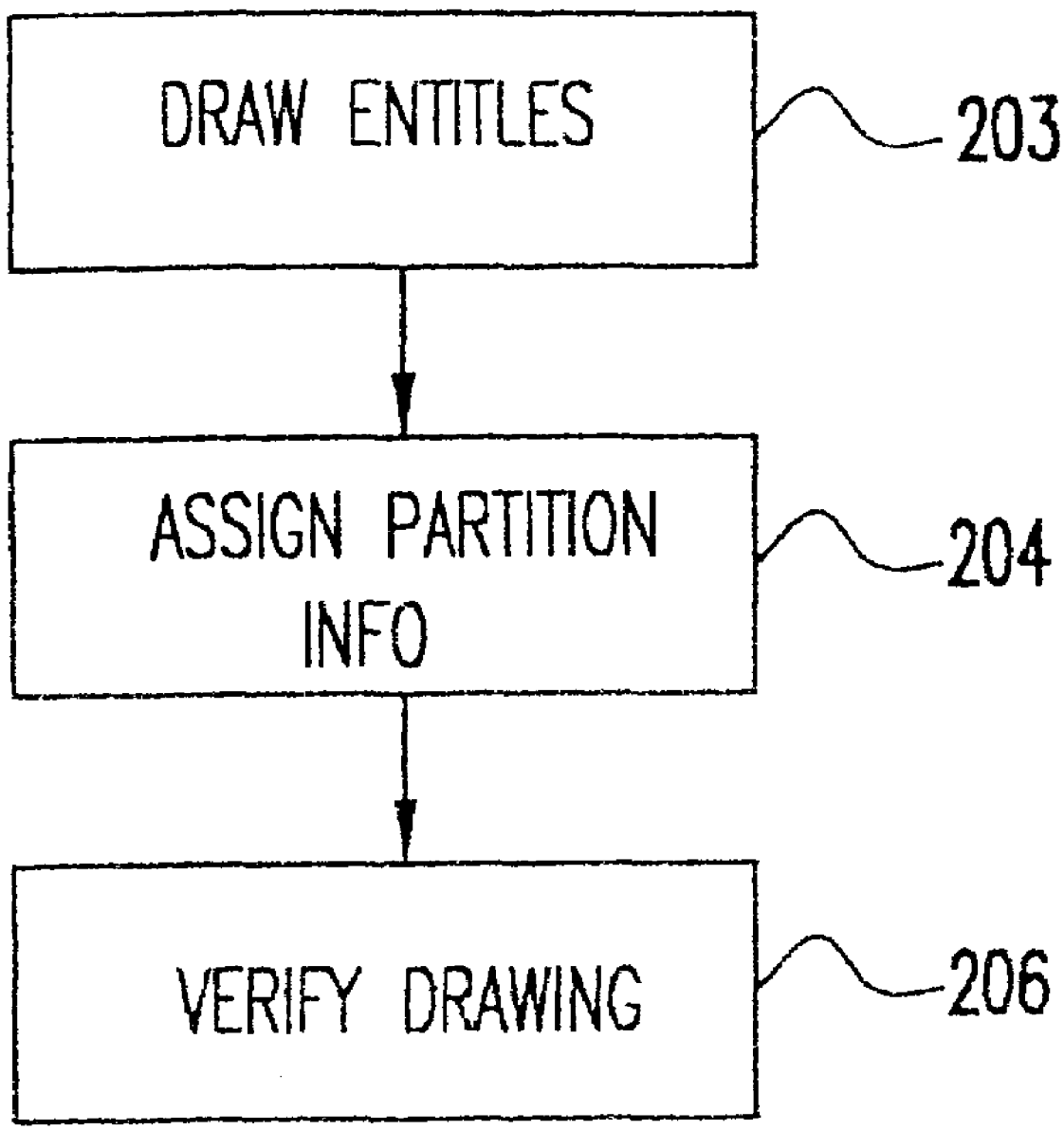
FIG. 5 is a flow diagram of a method for creating a drawing without pre-existing information.

Referring to FIG. 5, if the user starts from scratch and intends to implement a complete vector database, formatting a drawing will consist, only of drawing entities in function block 203, and assigning partition information to the drawing in function block 204.

In the preferred embodiment, partitions are drawn and existing partitions can be modified. Any entity or drawing object can be converted into a formatted partition on a particular floor. The type of partition of a previously formatted entity can be modified. The floor on which a particular formatted object resides can also be changed. Objects will still remain visible in the drawing after converting them to partitions on other floors. These objects may be hidden at the user's discretion. A user can display partition information by selecting objects in the drawing requesting partition information in the command menu. A text window containing the returned information regarding the object's type, location, length, and electrical attributes such as attenuation factor is displayed.

If more than one drawing is used to define the environment, they must be assembled before final verification. An automated procedure combining several separate single floor drawings into one multi-floored drawing may be executed.

Finally, the drawing is verified in function block 206, as described above. This verification will automatically make corrections to the legend that may have been corrupted after assembling several drawings into one file. Methods for formatting a drawing from scratch are discussed below.

Referring now to FIG. 6, a method is shown to format a raster image into a drawing that can be used for modeling. Because computer monitors represent images by displaying them on a grid, both vector and raster images are displayed on screen as small squares or dots known as pixels. Raster images only consist of a rectangular grid of pixels.

The image file formats supported by the present invention include the most common formats used in major technical imaging application areas: computer graphics, document management, and mapping and geographic information systems (GIS). The present invention determines the file format from the file contents, not from the file extension. Thus, additional formats could be added easily by including their translation parameters in the method.

Often times only a scanned image of a floor plan is available, as shown in FIG. 2. A user can insert a raster or bit-mapped black and white, 8-bit gray, 8-bit color, or 24-bit color image file into the drawing. Users can insert images in a variety of formats, currently including BMP, TIF, RLE, JPG, GIF, and TGA. More than one image can be displayed in any viewport, and the number and size of images is not limited. Once the raster image is no longer needed, the user can detach the image from the drawing.

Figure 6A:
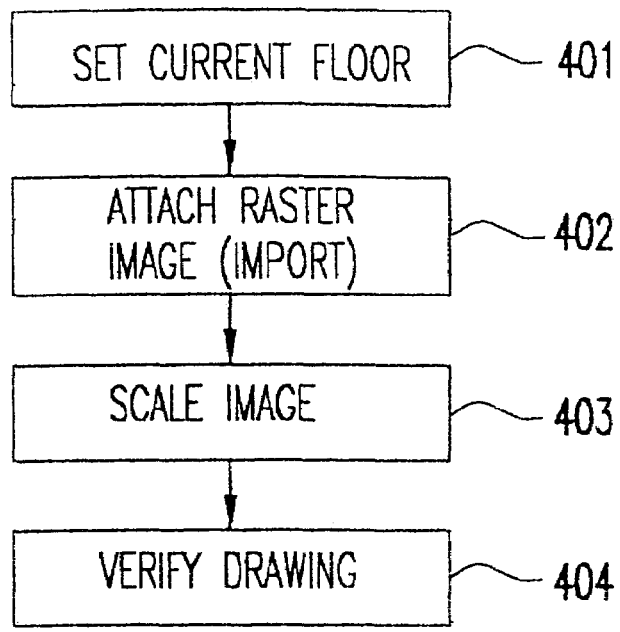
FIG. 6A is a flow diagram of a method for generating drawings from pre-existing raster images to be used only with distant dependent wireless system performance prediction models.

There are two preferred ways that a scanned image can be formatted. The first approach for formatting a raster image is shown in FIG. 6A. First the current floor is set in function block 401. In a new drawing, this creates the necessary floor layers based upon the user's selection. Therefore, any newly drawn partitions will reside on the current floor as chosen by the user. Then the image is imported in function block 402 and scaled in function block 403. Finally the drawing is verified in function block 404. Since this drawing originally did not contain any vector objects, the drawing database consists only of an image of the given environment that has been scaled to the proper dimensions. It does not contain information with regard to physical objects within the environment. Depending on the application, this may be sufficient for engineering use, for instance, when a wireless propagation prediction model only uses distance and does not rely on knowledge of the physical environment.

Figure 6B:
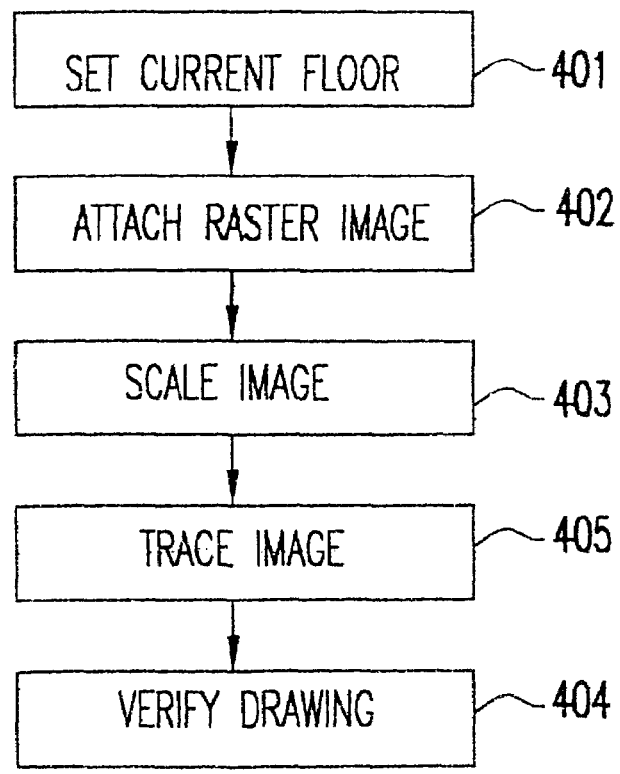
FIG. 6B is a flow diagram of a method for generating drawings from pre-existing raster images to be used with any number of wireless system performance prediction models.

The second approach for formatting a raster image is shown in FIG. 6B. This method is similar to the method shown in FIG. 6A with the addition of function block 405. The scanned image is "traced" by the user to draw partitions and other obstructions prior to verification in function block 404. This method is similar to drawing a vector based drawing from scratch, except that the scanned image provides a trace guide. The end result is a drawing that can be used by all wireless system prediction models, including those which rely on knowledge of the physical environment.

A distinct advantage of the present invention is that a true three-dimensional environment is rendered from the drawings and stored in the database. The ceiling heights (or building heights) that are specified are used to determine the vertical height of any partitions found on a given floor. A height is defined for a category of partitions and this defines the object's height for each entity in that category. This is done automatically during the formatting process. Thus, even though the formatting process was strictly two-dimensional in nature, when the formatting of a drawing is completed, the resulting drawing is a true three-dimensional environment. The user can see the three-dimensional building structure by altering the viewpoint.

The present invention can be used to create single floor drawings that can later be assembled into one multi-floored drawing or it can be used to create one or several multi-floored drawings all at once. After creating a single floor, all entities that are not partitions should be removed from the drawing. Thus, if a raster image was used as a reference for tracing partitions, it should be erased once the tracing is complete. The method provides assistance to the user to distinguish between partition and non-partition objects. Typically, objects referred to as formatted objects are partition objects and objects referred to as unformatted objects are non-partition objects.

The final stage of formatting a drawing involves several verification steps. These steps are automatically sequenced, as described above. Before each step is performed, the user is asked whether that step has yet been performed. If the user answers "Yes", then that step is skipped and the user is asked about the next step. Otherwise, the current step is performed and the user is prompted for any necessary information. When all steps have been completed, the drawing is saved. Unnecessary drawing information should then be purged. The formatted drawing should then be saved again.

This formatted drawing can now be used in any number of applications. Specifically, it may be used in wireless communication system engineering, planning and management tools for in-building or microcell wireless systems, for instance as described in the co-pending applications: Ser. No. 09/318,842; Ser. No. 09/318,840; and Ser. No. 09/221,985, the complete contents of each being herein incorporated by reference. It may also be useful in any other number of applications that require a 3-D model of a building, campus or urban environment.

While the invention has been described in terms of a single preferred embodiment, those skilled in the art will recognize that the invention can be practiced with modification within the spirit and scope of the appended claims.

Having thus described our invention, what we claim as new and desire to secure by Letters Patent is as follows:

1. A computer implemented method for creating, formatting or editing a database for representing a three dimensional physical environment where a wireless communications network will be deployed, comprising the steps of:

accepting at least one raster image representing a physical environment in which an in-building or campus communications network is or will be deployed;

verifying the sufficiency of said at least one raster image to provide a useful definition of said three dimensional physical environment, said verifying step producing a verified set of data defining said three dimensional physical environment, wherein said verifying the sufficiency step includes scaling said at least one raster image;

notifying a user of results of said verification of sufficiency;

using the resulting verified set of data to generate at least one formatted drawing or a set of formatted data which includes at least one or more objects for use in and being transportable to a communications engineering or network management application; and rendering a three dimensional view representative of said physical environment using the drawing or set of formatted data having the at least one or more objects.

2. The method of claim 1 wherein said notifying step is automatically performed without feedback being provided to the user.

3. The method of claim 1 wherein said notifying step is performed by prompting the user and, when required to provide said useful definition, requires the user to correct any insufficiencies in response to an insufficiency notification received via the computer.

4. The method of claim 1 wherein said communications engineering or network management application is selected from the group consisting of one or more of wireless propagation prediction, measurement tools, component placement or layout visualization tools, optimization tools, bill of materials generating tools, and network performance management or prediction tools.

5. The method of said claim 1 further comprising the step of adding or deleting at least one object in said at least one formatted drawing or said set of formatted data.

6. The method of claim 1 further comprising the step of editing at least one object in said at least one formatted drawing or said set of formatted data.

7. The method of claim 1 further comprising the step of moving at least one object in said at least one formatted drawing or said set of formatted data.

8. The method of claim 1 further comprising the step of removing extraneous objects from said at least one raster image.

9. The method of claim 1 further comprising the step of tracing and adding a traced object to said at least one formatted drawing or said set of formatted data.

10. The method of claim 9 wherein either or both of said steps of tracing and adding are performed before said verifying step.

11. The method of claim 1 further comprising modifying at least one of electrical properties, physical properties, aesthetic properties, and spatial configuration of at least one object.

12. The method of claim 11 further comprising the step of moving an object in said set of formatted data or said at least one formatted drawing.

13. The method of claim 1 further comprising the step of editing or modifying an object in said set of formatted data or said at least one formatted drawing.

14. The method of claim 1 further comprising the step of removing extraneous objects from said one or more objects.

15. The method of claim 1 further comprising the step of tracing and adding data representing a traced object.

16. The method of claim 1 further comprising the step of adding measurements to said at least one formatted drawing or said set of formatted data.

17. The method of claim 1 further comprising the step of adding measurements to said verified set of data.

18. The method of claim 1 further comprising the step of specifying or invoking a propagation model for performing predictions of performance.

* * * * *

UNITED STATES PATENT AND TRADEMARK OFFICE
CERTIFICATE OF CORRECTION

| | | |
|---|---|---|
| PATENT NO. | : 7,711,687 B2 | Page 1 of 2 |
| APPLICATION NO. | : 10/807388 | |
| DATED | : May 4, 2010 | |
| INVENTOR(S) | : Rappaport et al. | |

It is certified that error appears in the above-identified patent and that said Letters Patent is hereby corrected as shown below:

ON THE FACE PAGE

1. On Page 3, in Field (56), under "OTHER PUBLICATIONS", in Column 1, Line 27, delete "Acuuracy" and insert -- Accuracy --, therefor.

2. On Page 3, in Field (56), under "OTHER PUBLICATIONS", in Column 1, Line 43, delete T.S. Rappapoprt" and insert -- T.S. Rappaport --, therefor.

3. On Page 3, in Field (56), under "OTHER PUBLICATIONS", in Column 1, Line 55, delete "T.S. Rapaport" and insert -- T.S. Rappaport --, therefor.

4. On Page 3, in Field (56), under "OTHER PUBLICATIONS", in Column 1, Line 71, delete "Wireles" and insert -- Wireless --, therefor.

5. On Page 3, in Field (56), under "OTHER PUBLICATIONS', in Column 2, Line 3, after "vol." delete "vol.".

6. On Page 3, in Field (56), under "OTHER PUBLICATIONS", in Column 2, Line 5, delete "Skidmorre" and insert -- Skidmore --, therefor.

7. On Page 3, in Field (56), under "OTHER PUBLICATIONS", in Column 2, Line 27, delete "PlaNEt." and insert -- PlaNET. --, therefor.

8. On Page 3, in Field (56), under "OTHER PUBLICATIONS", in Column 2, Line 66, delete "Panner" and insert -- Planner --, therefor.

IN THE SPECIFICATION

9. In Column 7, Line 31, delete "Vol" and insert -- Vol. --, therefor.

Signed and Sealed this
Eighth Day of November, 2011

David J. Kappos
*Director of the United States Patent and Trademark Office*

10. In Column 10, Line 60, delete "Tums" and insert -- Turns --, therefor.